US009756700B2

(12) United States Patent
Trouwborst et al.

(10) Patent No.: US 9,756,700 B2
(45) Date of Patent: Sep. 5, 2017

(54) SAFETY PROTECTION ARRANGEMENT FOR A LIGHTING ARRANGEMENT

(71) Applicant: KONINKLIJKE PHILIPS N.V., Eindhoven (NL)

(72) Inventors: Marius Leendert Trouwborst, Den Bosch (NL); Ramon Antoine Wiro Clout, Eindhoven (NL); Jacobus Petrus Johannes Van Os, Eindhoven (NL); Franciscus Antonius Kneepkens, Waalre (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/303,531

(22) PCT Filed: Apr. 21, 2015

(86) PCT No.: PCT/EP2015/058555
§ 371 (c)(1),
(2) Date: Oct. 12, 2016

(87) PCT Pub. No.: WO2015/165769
PCT Pub. Date: Nov. 5, 2015

(65) Prior Publication Data
US 2017/0048936 A1 Feb. 16, 2017

(30) Foreign Application Priority Data

May 1, 2014 (EP) .................................... 14166766

(51) Int. Cl.
*H05B 33/08* (2006.01)
*F21V 33/00* (2006.01)
(Continued)

(52) U.S. Cl.
CPC ........... *H05B 33/089* (2013.01); *F21V 25/10* (2013.01); *F21V 33/0008* (2013.01);
(Continued)

(58) Field of Classification Search
CPC .... H05B 37/02; H05B 33/08; H05B 33/0845; H05B 33/089; H05B 33/0893;
(Continued)

(56) References Cited

U.S. PATENT DOCUMENTS 5,032,705 A 7/1991 Batcheller et al.
7,029,140 B2 4/2006 Wong et al.
(Continued)

FOREIGN PATENT DOCUMENTS

EP 2222137 A1 8/2010
EP 1905112 B1 4/2011
(Continued)

OTHER PUBLICATIONS

Sparkfun Electronics, "Wearable Electronics" LIT Costume Wig, Downloaded From https://forum.sparkfun.com/viewtopic.php?t=29991&p=133897 on Mar. 6, 2014, 6 Pages.
(Continued)

*Primary Examiner* — Jimmy Vu

(57) ABSTRACT

A safety protection arrangement is provided for a lighting arrangement. An electrical parameter is measured with the driving of the lighting arrangement with particular driving settings and it is compared with an estimated expected value of the electrical parameter so that a safety warning signal or a shutdown can be provided in the event of a detected system failure.

13 Claims, 5 Drawing Sheets

(51) Int. Cl.
  *F21V 25/10* (2006.01)
  *G01R 31/44* (2006.01)
  *F21Y 115/10* (2016.01)

(52) U.S. Cl.
  CPC ......... *G01R 31/44* (2013.01); *H05B 33/0845* (2013.01); *H05B 33/0893* (2013.01); *F21Y 2115/10* (2016.08); *Y02B 20/341* (2013.01)

(58) Field of Classification Search
  CPC ......... G01R 31/44; F21V 25/10; F21V 33/00; F21V 33/0008; F21Y 2115/10; Y02B 20/341
  USPC .... 315/121, 185 R, 224–226, 291, 307, 308, 315/312
  See application file for complete search history.

(56) References Cited

U.S. PATENT DOCUMENTS

| | | | |
|---|---|---|---|
| 7,239,238 | B2 | 7/2007 | Tester et al. |
| 2003/0015973 | A1 | 1/2003 | Ovens et al. |
| 2007/0040696 | A1 | 2/2007 | Mubaslat et al. |
| 2011/0273282 | A1 | 11/2011 | Ohsawa |
| 2012/0242507 | A1 | 9/2012 | Nguyen et al. |
| 2012/0274544 | A1* | 11/2012 | Nakajima ................ G01K 7/42 345/101 |
| 2013/0021811 | A1* | 1/2013 | Goldwater ................ F21S 4/22 362/473 |
| 2013/0200807 | A1 | 8/2013 | Mohan et al. |

FOREIGN PATENT DOCUMENTS

| | | |
|---|---|---|
| EP | 1246954 B1 | 12/2013 |
| WO | 2009148595 A2 | 12/2009 |
| WO | 2010086758 A1 | 8/2010 |
| WO | 2011041423 A2 | 4/2011 |

OTHER PUBLICATIONS

Mattila, "Intelligent Textiles and Clothing", The Textile Institute, 2006, 525 Pages.

Hardy, "Design and Construction of Smart Structures for Technical Textiles", University of Leeds School of Design, May 2008, pp. 1-241.

* cited by examiner

SAFETY PROTECTION ARRANGEMENT FOR A LIGHTING ARRANGEMENT

CROSS-REFERENCE TO PRIOR APPLICATIONS

This application is the U.S. National Phase application under 35 U.S.C. §371 of International Application No. PCT/EP2015/058555, filed on Apr. 21, 2015, which claims the benefit of European Patent Application No. 14166766.7, filed on May 1, 2014. These applications are hereby incorporated by reference herein.

FIELD OF THE INVENTION

The invention relates to lighting arrangements and in particular to safety protection devices for lighting arrangements, for example to provide a cut-off in the event of an electrical short circuit.

BACKGROUND OF THE INVENTION

To ensure a safe system, most electrical equipment is equipped with an electrical fuse. When electrical wires are accidently shorted, a high current will flow locally. This can be avoided by an electrical fuse, shutting down the system when the current becomes higher than the expected current during normal use.

Electrical fuses are not effective for some types of lighting system, for example lighting systems consisting of a large number of lights (such as LEDs) connected to form a large wired network. Examples of this type of lighting systems are wearable lighting applications or sleeping bags equipped with lighting.

There are two reasons why this type of lighting system requires a different safety system. First of all, the resistance of multiple LEDs connected in series while turned ON is low and can even be comparable to the internal resistance of the wires. As a consequence, the total current during normal operation can be similar to the total current in the case of a short, making it difficult to detect shorts. For this reason, a regular fuse is not an effective safety feature.

The second reason why a fuse is not always effective arises when the LEDs are controlled individually. In this case, the resistance of the total system is strongly dependent on the number of LEDs that are turned on. Thus, for a system which is configurable in different ways, the required fuse current cannot easily be set.

Even if a normal operation has only a small number of LEDs turned on, a large fuse is still needed to allow the extraordinary case when all LEDs are turned on for a short time. This makes it difficult to limit the current through the system.

Electrical lighting circuits that are worn close to the body can present safety risks. For example, when the electrical wiring or the LEDs fail, the power dissipation can locally increase. This can result in local hot spots, which can harm the skin, or even ignite flames of the textile clothing.

SUMMARY OF THE INVENTION

The invention is defined by the claims.

According to the invention, there is provided a safety protection arrangement for a lighting arrangement, comprising:

a measurement arrangement for measuring an electrical parameter associated with the driving of the lighting arrangement with at least one particular driving setting;

an estimation arrangement for estimating an expected value of the electrical parameter based on the at least one particular driving setting of the lighting arrangement;

an analysis arrangement for comparing the measured value with the estimated value to detect a system failure, and providing a safety signal in the event of a detected system failure, wherein one of the at least one particular driving settings is the OFF state of the lighting arrangement.

This arrangement enables an electrical parameter (or set of electrical parameters) to be measured and compared with expected values to derive a fuse function. The particular driving settings may comprise normal use of the LEDs, but other driving settings may be used which give more reliable fuse indication results. For example, the driving settings may comprise the LEDs turned off as the LEDs have a much higher resistance in the off state so that a short can more easily be detected. The LEDs may be turned off for example by lowering the drive voltage.

The intensity of the LEDs may be temporarily reduced before measuring possible failure, this reduction in intensity may be achieved by lowering the drive voltage.

The lighting arrangement may be configurable to provide different outputs, and the driving settings may then comprise the lighting arrangement configuration. In this case, the arrangement may take into account the configuration of the lighting arrangement to derive an expected electrical parameter, which can be compared with a monitored value to implement a safety warning system. As the lighting arrangement is configurable, the measured (and estimated) signals can strongly vary over time. Therefore, the measurement, estimation and analysis is preferably performed in real time.

This approach uses a driving setting in the form of a particular configuration of the LEDs. In a configurable system, the LEDs can also be turned off using the data cable rather than by manipulating the drive voltage.

The analysis arrangement may be for providing a shutdown based on the safety warning signal. In this case, the safety signal is not presented as an output, but is used to instigate a system shut down.

In one example, the electrical parameter may comprise a current supplied to the lighting arrangement. This current will vary according to the number of lighting units which are turned on as well as a brightness setting.

In another example, the electrical parameter may comprise a voltage of the supply to the lighting arrangement. A voltage within the lighting circuit may also vary according to the number of lighting units which are turned on as well as a brightness setting.

In another example, the electrical parameter may comprise a data signal which sets the configuration of the lighting arrangement. The way the data signal is processed may provide an indication of whether the lighting system is functioning correctly.

In another example, the electrical parameter may comprise a resistance which is dependent on the configuration of the lighting arrangement. By measuring the resistance, it can be determined if the lighting system has the resistance corresponding to the expected value.

The system thus implements four steps. First, one or more signals are measured such as the current going through the lighting arrangement, the voltage drop over the lighting arrangement and the data signals driving the system. Second, the signal or signals are estimated by calculations taking into account the properties of the system (like the resistances of all the components and the driving voltage) and the expected behavior of the system (the functional components that are turned on). Third, the measured values are compared to the estimated values. When there is a mismatch (even after taking into account an error margin)

the system has detected a failure and triggers the last step, which may either be to provide a warning or automatically turn off the system.

The estimation arrangement may take into account the driving voltage level and the resistance of the lighting arrangement components to estimate the expected value of the electrical parameter.

As mentioned above, the safety protection system can be applied to a wearable lighting arrangement in the form of a plurality of LEDs, which are configurable to be driven to different brightness settings and/or with different numbers of the LEDs activated.

The invention also provides a method of detecting system failure of a lighting arrangement comprising a plurality of LEDs, the method comprising:

determining an electrical parameter associated with the driving of the lighting arrangement with at least one particular driving setting;

estimating an expected value of the electrical parameter based on the at least one particular driving setting of the lighting arrangement;

comparing the measured value with the estimated value to detect a system failure after switching off all or a selection of the LEDs; and providing a safety signal in the event of a detected system failure.

A shut down may be provided based on the safety signal.

The electrical parameter may comprise one or more of:
a current supplied to the lighting arrangement;
a voltage of the supply to the lighting arrangement;
a data signal which sets the configuration of the lighting arrangement; and
a resistance which is dependent on the configuration of the lighting arrangement.

The system failure to be detected may comprise an electrical short.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a safety protection arrangement for a lighting arrangement. An electrical parameter is measured (with the driving of the lighting arrangement with particular driving settings) and it is compared with an estimated expected value of the electrical parameter so that a safety warning signal or a shutdown can be provided in the event of a detected system failure. The lighting arrangement can be configurable to provide different outputs, and the driver setting may then correspond to the particular configuration.

Figure 1:
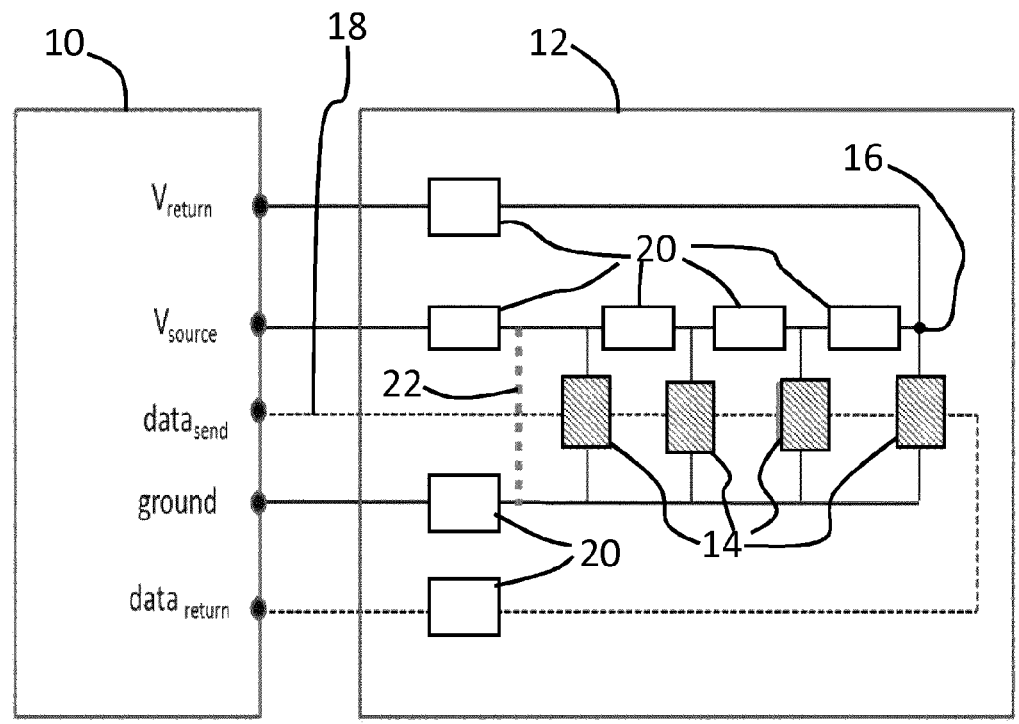
FIG. 1 shows a first example of a lighting system.

FIG. 1 shows a lighting system comprising a controller 10 and a lighting arrangement 12.

The lighting arrangement 12 comprises an array of lighting units, such as LEDs 14. In the example shown, the LEDs are connected in parallel between a supply voltage Vsource provided by the controller 10 and ground.

The voltage at the end of the ladder (node 16) is provided as a feedback signal to the controller 10, and defines a return voltage Vreturn.

In this example, the LEDs 14 are controlled by a data line 18 to which a data control signal $data_{send}$ is provided by the controller. Having passed through all LEDs, the data control signal is returned as signal $data_{return}$.

The blocks 20 shown in FIG. 1 represent the wire resistances.

The invention provides a system for detecting failure within the lighting arrangement 12, for example for detecting the presence of a short such as shown as the connection 22.

Figure 2:
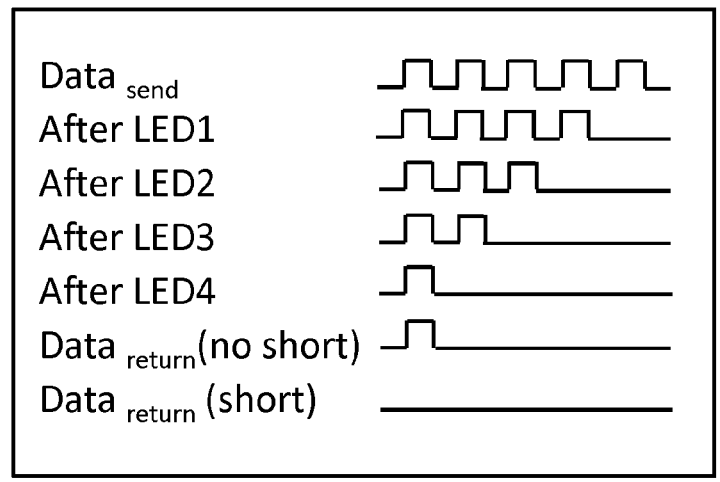
FIG. 2 shows examples of the data signal used in the system of FIG. 1.

Typical data signals received from the individually addressable LEDs are plotted in FIG. 2. A data signal $Data_{send}$ is provided to the LED array, comprising a sequence of bits/bytes, each one for a respective one of the LEDs. Each LED uses a certain part (containing one or more bits) of the incoming data signal, and regenerates the data signal with its part removed, for processing by subsequent LEDs.

In the case of a short circuit (signal "$Data_{return}$(short)"), the data signals are not processed properly and the data return signal is different than from a system without a short circuit (signal "$Data_{return}$(no short)"). Thus, in this type of configurable system, the way the data signal is processed can be used as an indication of a short.

There are various other electrical parameters which can be sensed by the controller 10 and which depend on the configuration of the lighting arrangement 12 and/or the presence of a short.

For example, with reference to the arrangement of FIG. 1:

The return voltage Vreturn will depend on how many of the LEDs 14 are conducting. When turned on, the LEDs draw current which will influence the current flowing through the series resistances, and thereby change the voltage at node 16.

The current drawn from the line Vsource will vary in dependence on the number of LEDs drawing a current.

The data signal $data_{send}$ and/or the returned data signal $data_{return}$ can be used to determine the lighting configuration.

The resistance of the network between Vsource and ground is also dependent on the configuration of the lighting arrangement.

This provides various different measurements which can be made and which will vary depending on the configuration of the lighting arrangement. Thus, based on the known configuration of the lighting arrangement, expected values of the electrical parameter (which may be one or more values) can be derived.

Furthermore, some or all of the measurements are chosen such that they vary in the event of a short.

A margin of error can be applied to reduce the chance of a false safety message or unnecessary shut off operation. This margin of error can be determined based on system modeling, or it may simply be a scaling of the expected parameter value. For example, if the expected current is 1 A, and a higher current is indicative of a fault, the values used for comparison with the measured current may be 20% higher, i.e. 1.2 A. The same logic can be applied to the other possible parameters, and they may be increased or decreased using the margin of error. For example, the resistance of the lighting arrangement is expected to decrease in the event of a short, so that the expected resistance value can be reduced by a margin of error to create the value used for comparison. Different margins of error (e.g. 10%, 20%, 30% or even 50%) may be appropriate depending on how accurate the estimates are expected to be, and how much variation is expected in the event of the types of system failure (e.g. shorts) expected.

As explained above, at least some of the measurements vary in the event of a short as well as in dependence on the lighting arrangement configuration. For example, for the short 22 shown in FIG. 1:

The return voltage Vreturn will be lower since there is a ground connection.

The current drawn from the line Vsource will be higher because of the short to ground.

The returned data signal $data_{return}$ will be different compared to the case without a short circuit, such as containing fewer bits or no bits at all.

The resistance of the network between Vsource and ground will be reduced by the short.

For an implementation based on a configurable lighting arrangement (i.e. a lighting system having active control of the individual lighting units or groups of lighting units), one or more of these parameters can be measured, and it can be determined if they meet expected values which take into account the configuration of the lighting arrangement.

Figure 3:
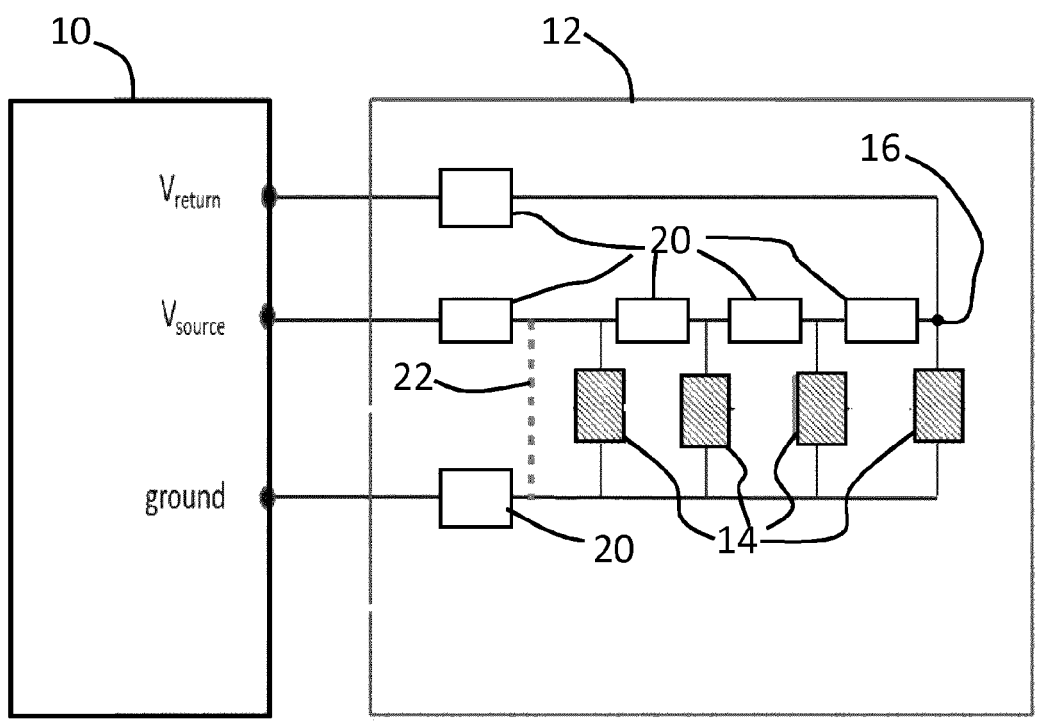
FIG. 3 shows a second example of a lighting system.

The invention can instead be applied to a passive system, with no data input, as shown in FIG. 3. In this case, the supply voltage, return voltage and ground voltage, as well as the current flowing to the supply or back to ground are available as measurement parameters.

In this case, the configuration of the lighting system remains static in normal use. However, the driving settings may be varied in other ways, to enable a fuse detection function to be implemented more reliably.

For example, all LEDs, or a fraction of the LEDs, can be turned off by lowering the supply voltage Vsource below the normal operating voltage. The resistance between the power connections (Vsource and ground) can then be measured. Alternatively, all or a fraction of the LEDs can be turned off again by lowering the supply voltage, and the current drawn from the supply can be measured.

As LEDs have a high resistance in the OFF state, it is possible to detect any shorts between the wires because shorts have a low ohmic behavior. This procedure can be carried out periodically in a very short time scale, not visible to the human eye.

The concept of causing certain LEDs to be turned off can also be applied to the configurable system of FIG. 1, but using the data line instead of manipulating the supply voltage. Thus, rather than relying on user-selected configurations, the system may impose its own configurations for the purposes of the safety test.

Figure 4:
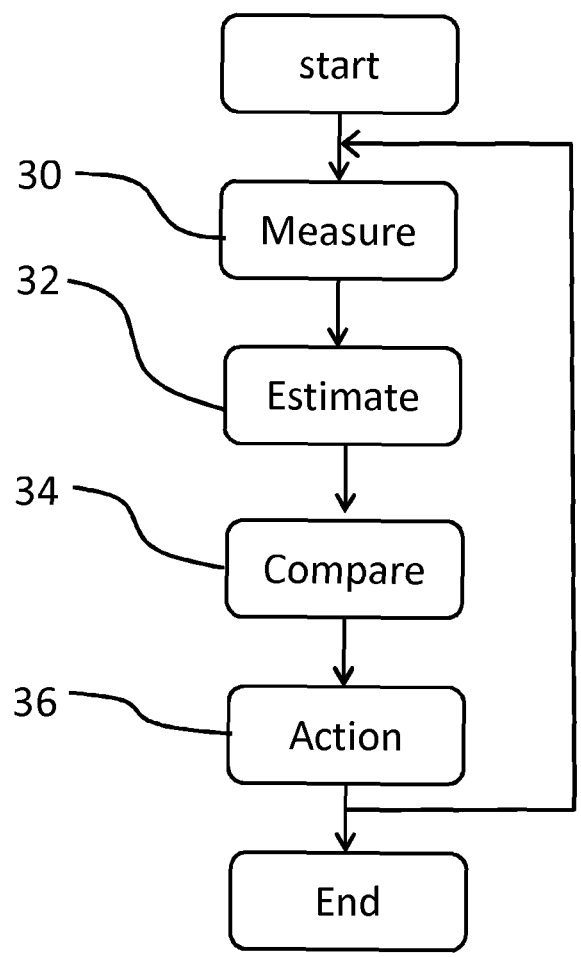
FIG. 4 shows a method of providing a safety signal or shut down function.

FIG. 4 shows a flow diagram of the method performed.

Step 30 involves determining one or more of the electrical parameters outlined above with the lighting arrangement with particular driving settings.

This determining step may comprise a measuring step so that the prevailing drive configuration for example as set by the user can be measured. Alternatively, the determining may be based on settings applied for the purposes of the safety test, such as an applied drive voltage.

Thus, these driving settings may relate to the lighting configuration as specified by the data line (either user-selected or imposed by the system), or they may relate to the drive voltage to be applied for a passive system. In the case of a particular configuration of an active lighting system, this is known by the controller, since it is used to set the lighting arrangement into its configuration. In the case of a particular driving voltage, this is also set by the controller.

Step 32 involves estimating the one or more of the electrical parameters outlined above by assuming the lighting arrangement has the particular driving settings applied.

Step 34 involves comparing the measured and estimated parameter or parameters.

Step 36 involves providing a warning or shutting off the system in the event of a detected failure.

A first embodiment functions as a variable fuse. In this case, the current drawn from the supply is limited to a value that is estimated by taking into account the driving settings, such as the lighting arrangement configuration (in particular how many LEDs are turned ON) and the resistance of all the components and wires. The estimated current will vary over time for dynamic lighting systems, and the fuse current (maximum current) will also vary over time.

The current drawn can be measured based on the current flowing out of the Vsource pin, for example by monitoring the voltage across a resistor in series with the Vsource output.

A second embodiment is based on measuring the voltage drop over the voltage supply wire. By comparing the measured value with the estimated value, shorts can be easily detected.

A third embodiment is based on measuring the data return signal and comparing it with estimated values. Failures in the LED package can affect the data signal going through the LEDs as explained above.

A fourth embodiment is based on turning off all LEDs, or a fraction of the LEDs using the data signal, and measuring the resistance between the power connections (Vsource and ground). Alternatively, all or a fraction of the LEDs can be turned off and the current drawn from the supply can be measured.

A fifth embodiment is based on turning off all LEDs, or a fraction of the LEDs by controlling the supply voltage, and again measuring the resistance between the power connections (Vsource and ground) or the current drawn from the supply.

Figure 5:
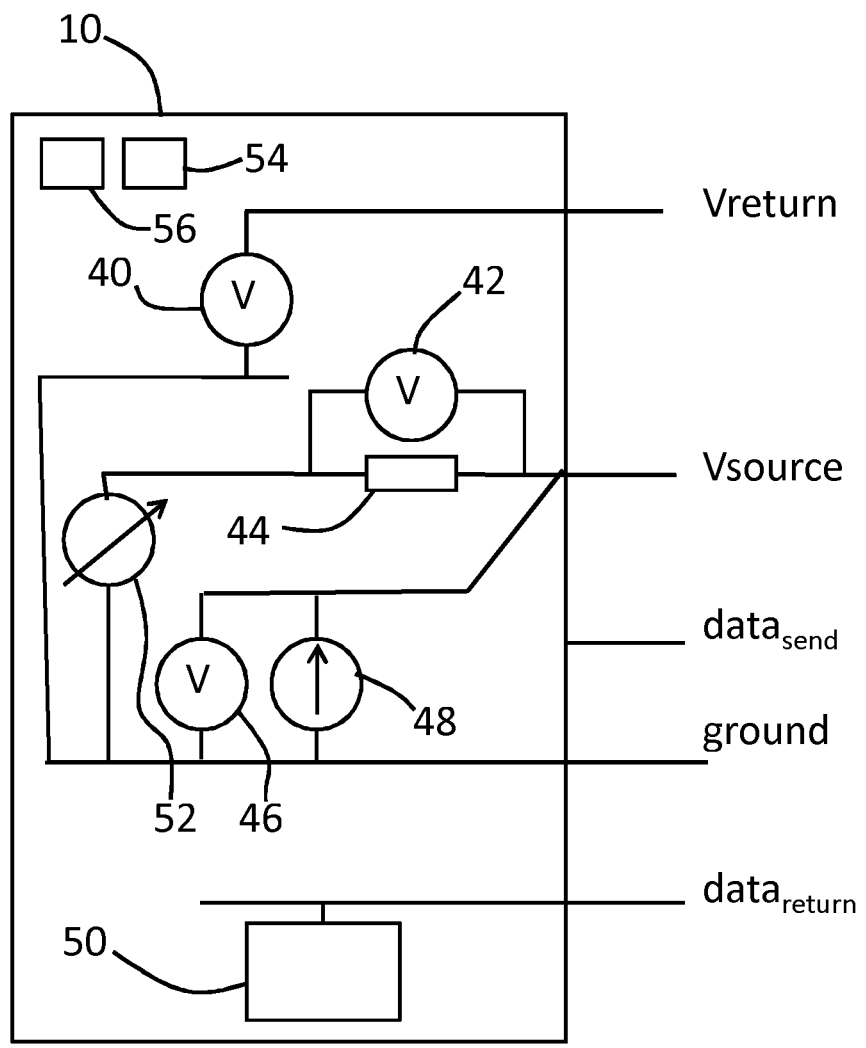
FIG. 5 shows an example of how to modify the system of FIG. 1 to implement the method of FIG. 4.

FIG. 5 shows how the controller 10 can be modified to implement the approaches explained above.

A first measuring arrangement comprises a voltage measuring unit 40 between the return line Vreturn and ground.

A second measuring arrangement comprises a voltage measuring unit 42 across a series resistor 44 in series with the supply line Vsource.

A third measuring arrangement comprises a current source 46 for injecting a current to the supply line Vsource (with the source voltage disconnected) and a voltage measuring unit 48 for measuring the resulting voltage, from which the resistance can be derived.

A fourth measuring arrangement comprises a voltage measurement unit 50 which measures the data return line signal (with reference to ground).

FIG. 5 also shows a variable voltage source 52 which applies a selective voltage level as the source voltage Vsource. The variable voltage setting functions as a measurement value (although it does not need to be measured but can be known from the setting applied) which again is indicative of the way the LEDs are driven.

There are four possible measurements outlined above (plus the voltage setting applied to the voltage source). Any one of these may be used, or else two or more may be combined to provide more robust fault diagnosis. For example, the current and voltage may be monitored, or the current and resistance, or the voltage and resistance. Thus, the "electrical parameter" may comprise one or more values, for example it may be a vector of a set of parameters.

The invention is of particular interest for lighting circuits that are worn close to the body. The lighting circuits may be for aesthetic purposes, such as for fashion, but also they may be for medical phototherapy products such as a pain relief light patch, and devices to treat psoriasis, acne, or jaundice.

Figure 6:
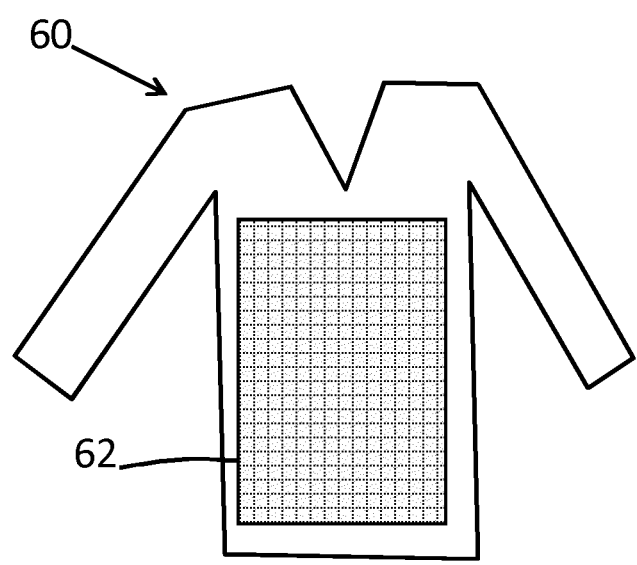
FIG. 6 shows an item of clothing incorporating a wearable lighting arrangement.

FIG. 6 shows an item of clothing 60 incorporating a wearable lighting arrangement 62.

Only one possible network of LEDs has been shown. The LEDs may instead be in series, or they may be arranged as a set of parallel LED strings, each string having a set of series LEDs. Other lighting units may be used instead of LEDs.

The estimation step, to determine an expected value for the electrical parameter (which may be one or more values) may be analytical and based on modeling of the lighting circuit, or else it may involve a calibration stage during which the circuit is initially tested to derive the normal operating characteristics of the electrical parameter.

As will be clear from the discussion above, the parameter being tested may be static, and tested periodically by suitable driving of the LED arrangement. This can be for a short period which is not perceptible to the user and it can be carried out repeatedly, for example every few seconds or minutes. When measuring the resistance as the electrical parameter to be monitored, the LEDs can be switched off periodically, or else the intensity may be reduced temporarily to measure the resistance.

Alternatively, the parameter can be tested dynamically for an active system which allows the user settings not to be interrupted. The threshold then evolves to match the user settings at any particular time.

The invention makes use of a controller, and two separate functions of estimation and analysis are described. The controller can be implemented in numerous ways, with software and/or hardware, to perform the various functions required. A processor is only one example of a controller which employs one or more microprocessors that may be programmed using software (e.g., microcode) to perform the required functions. A controller may however be implemented with or without employing a processor, and also may be implemented as a combination of dedicated hardware to perform some functions and a processor (e.g., one or more programmed microprocessors and associated circuitry) to perform other functions.

Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media such as volatile and non-volatile computer memory such as RAM, PROM, EPROM, and EEPROM. The storage media may be encoded with one or more programs that, when executed on one or more processors and/or controllers, perform at the required functions. Various storage media may be fixed within a processor or controller or may be transportable, such that the one or more programs stored thereon can be loaded into a processor or controller.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A safety protection arrangement for a lighting arrangement, the light arrangement comprising an array of lighting units, each lighting unit being an individually addressable LED, comprising:
   a measurement arrangement for measuring a value of an electrical parameter associated with the driving of the lighting arrangement with at least one particular driving setting, wherein the electrical parameter being a data signal which sets a configuration of the lighting arrangement, wherein the data signal comprises a sequence of bits/bytes and wherein the data signal is arranged to pass through each of the LEDs of the lighting arrangement;
   an estimation arrangement for estimating an expected value of the data signal based on the at least one particular driving setting of the lighting arrangement; and
   an analysis arrangement for comparing the measured value ($Data_{return}$) with the estimated value to detect a system failure, and providing a safety signal in the event of a detected system failure.

2. The safety protection arrangement as claimed in claim 1, wherein the lighting arrangement is configurable to provide different outputs, and the driving settings comprise the lighting arrangement configuration.

3. The safety protection arrangement as claimed in claim 1, wherein the analysis arrangement is for providing a shutdown based on the safety signal.

4. The safety protection arrangement as claimed in claim 1, wherein the electrical parameter comprises one or more of:
   a current supplied to the lighting arrangement;
   a voltage of the supply to the lighting arrangement; and
   a resistance which is dependent on the configuration of the lighting arrangement.

5. The safety protection arrangement as claimed in claim 1, for a wearable lighting arrangement.

6. A wearable lighting arrangement comprising:
   a lighting arrangement comprising a plurality of LEDs, which are configurable to be driven to different brightness settings and/or with different numbers of the LEDs activated; and
   a safety protection arrangement as claimed in claim 1.

7. The safety protection arrangement as claimed in claim 1, wherein the data signal is regenerated at each LED, wherein at each LED, a part of the data signal is processed and remaining part is passed to the subsequent LED in the lighting arrangement.

8. A method of detecting system failure of a lighting arrangement comprising a plurality of LEDs, each LED being an individually addressable LED, the method comprising:
   measuring a value of an electrical parameter associated with the driving of the lighting arrangement with at least one particular driving setting, the electrical parameter being a data signal which sets a configuration of the lighting arrangement, wherein the data signal comprises a sequence of bits/bytes and wherein the data signal is arranged to pass through each of the LEDs of the lighting arrangement;

estimating an expected value of the data signal based on the at least one particular driving setting of the lighting arrangement;

comparing the measured value ($Data_{return}$) with the estimated value to detect a system failure; and providing a safety signal in the event of a detected system failure.

9. The method as claimed in claim 8, wherein the lighting arrangement is configurable to provide different outputs and the driving settings comprise the lighting arrangement configuration.

10. The method as claimed in claim 8, comprising providing a shutdown based on the safety warning signal.

11. The method as claimed in claim 8, wherein the electrical parameter comprises one or more of:

a current supplied to the lighting arrangement;

a voltage of the supply to the lighting arrangement; and a resistance which is dependent on the configuration of the lighting arrangement.

12. The method as claimed in claim 8, for detecting system failure of a wearable lighting arrangement.

13. The method as claimed in claim 12, wherein the system failure comprises an electrical short.

* * * * *